(12) United States Patent
Haulin

(10) Patent No.: US 6,914,451 B2
(45) Date of Patent: Jul. 5, 2005

(54) ADAPTIVE LEVEL BINARY LOGIC

(75) Inventor: Tord Haulin, Uppsala (SE)

(73) Assignee: Optillion Operations AB, Stockholm (SE)

( * ) Notice: Subject to any disclaimer, the term of this patent is extended or adjusted under 35 U.S.C. 154(b) by 0 days.

(21) Appl. No.: 10/492,586

(22) PCT Filed: Oct. 17, 2001

(86) PCT No.: PCT/EP01/12022

§ 371 (c)(1),
(2), (4) Date: Apr. 15, 2004

(87) PCT Pub. No.: WO03/034592

PCT Pub. Date: Apr. 24, 2003

(65) Prior Publication Data

US 2004/0246022 A1 Dec. 9, 2004

(51) Int. Cl.[7] .......................................... H03K 19/0175
(52) U.S. Cl. .......................................... 326/82; 326/38
(58) Field of Search ........................ 326/37–41, 82–90

(56) References Cited

U.S. PATENT DOCUMENTS

| | | | |
|---|---|---|---|
| 4,091,297 A | 5/1978 | Stephens | |
| 4,414,512 A | 11/1983 | Nelson | |
| 4,775,808 A | 10/1988 | Trumpp | |
| 4,866,301 A | 9/1989 | Smith | |
| 5,003,203 A | 3/1991 | Win | |
| 5,077,496 A | 12/1991 | Wolczanski | |
| 5,159,340 A | 10/1992 | Smith | |
| 5,166,558 A | * 11/1992 | Ohsawa ...................... | 326/71 |
| 5,272,394 A | 12/1993 | Kirk et al. | |
| 5,361,006 A | 11/1994 | Cooperman | |
| 5,412,259 A | 5/1995 | Tokumaru | |
| 5,440,244 A | 8/1995 | Richter et al. | |
| 5,512,853 A | 4/1996 | Ueno et al. | |
| 5,528,172 A | 6/1996 | Sundstrom | |
| 5,717,343 A | 2/1998 | Kwong | |
| 5,739,704 A | 4/1998 | Clark | |
| 5,764,097 A | 6/1998 | Whitfield | |
| 5,933,026 A | 8/1999 | Larsen et al. | |

(Continued)

FOREIGN PATENT DOCUMENTS

| | | |
|---|---|---|
| DE | 199 30 183 | 10/2000 |
| EP | 0 036 950 | 10/1981 |
| EP | 0 051 343 | 5/1982 |
| EP | 0 481 530 | 4/1992 |
| EP | 0 844 736 | 5/1998 |
| EP | 1 041 719 | 4/2000 |
| EP | 1 011 196 | 6/2000 |
| JP | 63-287110 | 11/1988 |
| JP | 2000-36734 | 2/2000 |
| WO | WO 93/22837 | 11/1993 |
| WO | WO 98/28846 | 7/1998 |

OTHER PUBLICATIONS

International Preliminary Examination Report, PCT/EP 01/12002, Apr. 13, 2004.

*Primary Examiner*—Don Le
(74) *Attorney, Agent, or Firm*—Nixon & Vanderhye P.C.

(57) ABSTRACT

A digital logic interface circuit makes use of a logic signal representative of a logic signaling level definition, to determine the logic swing amplitude of signals from a given source adopting the same logic signaling level definition. The digital logic interface circuit generates a threshold level from the logic swing amplitude thus determined, and compares digital logic input signals against the threshold level in order to discriminate different logic levels in the digital logic input signals. The comparison result is provided as digital interface output signals adopting a predetermined logic signaling level definition for use by subsequent system sections. Examples of such representative signals are the digital input logic signals themselves, clock signals or line encoded signals. Other examples can be mode control signals or NRZ signals.

18 Claims, 5 Drawing Sheets

U.S. PATENT DOCUMENTS

| | | |
|---|---|---|
| 5,963,053 A | 10/1999 | Manohar |
| 5,969,646 A | 10/1999 | Cheng |
| 6,097,215 A | 8/2000 | Bialas |
| 6,212,402 B1 | 4/2001 | Rubbmark et al. |
| 6,242,949 B1 | 6/2001 | Wilford |
| 6,414,525 B2 * | 7/2002 | Urakawa .................... 327/112 |
| 6,615,301 B1 * | 9/2003 | Lee et al. .................... 710/106 |
| 6,806,728 * | 10/2004 | Nguyen et al. ............... 326/30 |

\* cited by examiner

ADAPTIVE LEVEL BINARY LOGIC

This application is the US national phase of international application PCT/EP01/12022 filed 17 Oct. 2001 which designated the U.S., the entire content of which is hereby incorporated by reference.

Interpretation of binary single ended (non-differential) logic signals encoded in the voltage or current domain requires comparison against one or sometimes two reference voltages. This reference voltage must be chosen such that the input signal can be interpreted with good noise immunity. The optimum reference or threshold level depends on what logic signaling level definition is used by the source. A variety of signaling level definitions is available today in the form of signaling standards. Known standardized logic signaling level definitions include for example TTL, CMOS, ECL and others.

FIELD OF THE INVENTION

Smaller and smaller physical transistor dimensions in integrated circuits require reduced supply voltages in order not to exceed field strength limitations. A fairly wide range of I/O signaling standards has been developed to fit the limitations of lower supply voltages. This variety of I/O signal standards can lead to compatibility problems. In circuit technologies that can operate with multiple supply voltages, different types of I/O cells can be developed. If the kinds of circuits to be connected to the various ports of the circuit under design are known beforehand, the right kind of I/O cells can be chosen for each port on the circuit at design time. In some applications, one set of port signals can be required to be able to communicate with other circuits that don't share a single common type I/O signal level standard.

PRIOR ART

If each application in a circuit uses fixed connections to other circuits, level shifting interface circuits can be placed in the paths between source and destination in order to adapt the logic levels of one circuit to the other. The type of level shifter must then be chosen to fit the I/O standards of the two circuits to be connected.

Fixed threshold input buffers are simple and straightforward to use. They are useful if the logic level on an input is known beforehand, stays constant throughout the life of the product and is the same in all applications where the product is used. Fixed threshold binary logic input cells are often implemented as CMOS inverters. This is a low complexity, low power implementation. The threshold level is however dependent on the drive strength ratio between PMOS and NMOS transistors, and thus sensitive to manufacturing process variations. For legacy logic signal standards with ample voltage swings between the logic zero and the logic one level, noise margins were large enough to handle such process variations without significant performance penalty. For newer low voltage I/O standards, in some cases the voltage swing between logic levels is scaled more than is manufacturing process precision and noise. Differential line receivers offer an opportunity to alleviate some of the tolerance problems. When used for single ended signals a reference threshold level can be created by means with much less susceptibility to process variations than is the CMOS inverter P/N ratio, as described in JEDEC standard JESD 8–11. The reference threshold level is determined with better precision but fixed throughout the life of the product.

A slightly more flexible solution is described in patent U.S. Pat. No. 5,751,166 to Shieh et al wherein is described a circuit that is able to change the threshold level for an input signal in response to the peak voltage of the input signal. If the peak value exceeds a limit defined by a reference voltage, the input signal is assumed to be a 5V CMOS logic signal. As long as the input signal peak level stays below the limit the input signal is assumed to be a TTL signal.

The peak level detector sets an RS-flip-flop that disables the peak detector and changes the threshold level for the input buffer in the signal path of the input signal to be optimized for 5V CMOS signals. This dual threshold input buffer does however have certain limitations that restrict its usefulness, including the ability to handle no: more than two specific logic level standards (TTL and 5V CMOS in the implementation shown in the patent) which must be chosen at design time and cannot be altered later, and the fact that the thresholds are predetermined by the CMOS P/N transistor drive strength ratio and thus more sensitive to process variations.

It is the object of the present invention to overcome these and other limitations of the prior art.

DESCRIPTION OF THE INVENTION

The digital logic interface circuit according to an embodiment of the present invention makes use of a logic signal representative of a logic signaling level definition, to determine the logic swing amplitude of signals from a given source adopting the same logic signaling level definition. The digital logic interface circuit generates a threshold level from the logic swing amplitude thus determined, and compares digital logic input signals against the threshold level in order to discriminate different logic levels in the digital logic input signals. The comparison result is provided as digital interface output signals adopting a predetermined logic signaling level definition for use by subsequent system sections. Examples of such representative signals are the digital input logic signals themselves, clock signals or line encoded signals. Other examples can be mode control signals or NRZ signals.

The digital logic signal interface circuit according to this embodiment can advantageously provide an adaptive interface between a digital logic processing section adopting a predetermined logic signaling level definition, and other system sections which adopt another logic signaling level definition which need not be known at design time. Advantageously, the digital logic signal interface circuit is integrated with the digital logic processing section on the same chip to render the latter capable of communicating with other circuits without being limited to a particular logic signaling level definition.

Level adaptive logic in accordance with the present invention can determine the optimum threshold voltage for a wide variety of signaling level definitions. Preferably, as an advantageous embodiment it can also send back to the source of an input signal or other destination a signal adapted to the same logic signaling level definition as that of the source. The logic signaling level definition can be binary or any other number of distinct logic levels appropriate for representing digital data.

According to one embodiment of the invention, there is provided a circuit which has means to receive one or more digital logic input signals having substantially the same logical high and logical low voltage levels, and to determine said logical high and logical low voltage levels from a representative one of said digital signals, which may be one of the digital logic input data signals, a clock signal, a line encoded data signal or the like. The logical signal amplitudes, e.g. logical high and logical low voltage levels in case of binary logic, are determined by utilization of peak detectors for extracting estimates of the logic high and logic low levels of said representative signal. Means may further be provided to determine a threshold voltage above which a signal is considered to be a logical high, and below which a signal is considered to be a logical low, from said estimates of said logic high level and said logic low level.

According to another embodiment of the invention there are provided transition detection means for detecting transitions in the voltage level of said representative signal, and sampling means for sampling one or more values of the amplitude level of said representative signal at predetermined times after the detection of a level transition in said representative signal as detected by said transition detection means. The transition detection means may also be disposed so as to discriminate between a positive and a negative transition in said representative signal.

According to one version of this embodiment the transition detector comprises a differential voltage comparator biased at a noise rejection offset from its equilibrium point by means of a feedback network creating a hysteresis for providing a positive noise rejection offset if the output of the differential voltage comparator is high and a negative noise rejection offset from the equilibrium if the output of the differential voltage comparator is low, which combined with an input signal capacitively coupled to the negative input of said differential voltage comparator, yields a sampling trigger, whenever the input signal exhibits a transient with a slope and amplitude exceeding said noise rejection offset voltage.

The transition detector may alternatively comprise a, delay locked loop involving an adjustable delay line, a phase comparator and a loop filter. In this embodiment said representative signal preferably is a periodic clock signal. The delay line provides a phase offset of essentially 90 degrees from said representative signal by letting the phase comparator with an equilibrium for 90 degrees phase offset control the delay line via the loop filter, such that the resulting delayed signal can be used to trigger sampling.

The transition detector may alternatively comprise a PLL creating a PLL oscillator signal with a period equal to a unit time interval occurring in the representative signal, for instance half the period of said representative signal if the representative signal is periodic, by locking the output signal from the PLL oscillator to said representative signal with a phase frequency comparator attaining equilibrium when non-sampling transitions of the PLL oscillator clock are essentially coincident with transitions of the representative signal, and sampling transitions of the PLL oscillator clock fall essentially in the middle of the symbol intervals of the representative signal, such that the resulting signal can be used to trigger sampling.

According to another embodiment of the invention, a first one of said sampling means is provided to sample said representative signal after a positive transition in said representative signal, and a second one of said sampling means is provided to sample said representative sample after negative transition in said representative signal. Said first and second sampling means may be sample and hold circuits, and wherein the sample taken by said first sampling means is taken to be representative of said logical high voltage level, and the sample taken by said second sampling means is taken to be representative of said logical low voltage level.

Two resistive elements may be coupled between the outputs of the sample and hold circuits in series, the voltage between the two resistors being taken to be representative of said threshold voltage. Advantageously the sample and hold circuits are edge triggered with a certain sampling delay from the edge to the sampling instant, such that overshoot and other spurious effects resulting from the transition do not adversely affect the signaling logic level amplitude estimation. Extending the sampling time can further reduce noise and thus, can further improve the logic level amplitude estimation accuracy. This can advantageously include processing the signal using a resistive sampling device, implementing a gated low pass filter together with a hold capacitor.

According to another embodiment of the invention there is provided a circuit which has means to receive one or more digital signals adopting the same logic signaling level definition such that they have substantially the same logical high and logical low voltage levels, and to determine a threshold voltage above which a signal is considered to be a logical high, and below which a signal is considered to be a logical low, from a representative one of said digital signals. This threshold is determined by averaging the amplitude of said representative signal over time. This can be achieved by low pass filter for extracting the DC component of the representative signal. In this embodiment it is preferable to use signals with a well defined duty cycle as representative signals. For example, a clock signal would be suitable.

According to another embodiment there are provided one or more transition detection means for detecting transitions in the voltage level of said representative signal, and sampling means for sampling one or more values of the voltage level of said representative signal at predetermined times after the detection of a transition as detected by a predetermined one of said transition detection means, and a time averaging means and such that the samples taken by said first sampling means and by said second sampling means are averaged together over a period which is long compared to the period between transitions on said representative signal, the resulting time average signal being taken to be representative of said threshold voltage. These first and second sampling means may comprise first and second MOS transistors whose gates are connected to a differentiator circuit comprising a series connection of a resistive element and a capacitive element embodying said transition detection means, whose sources are connected to said representative signal and whose drains are connected to said averaging means. This embodiment is advantageous in that it will operate satisfactorily even if the duty cycle of the representative signal is unknown or if the representative signal is a data signal wherein logic high and low levels alternate at random.

Either of the embodiments heretofore discussed may advantageously provide a logic high voltage rail and a logic low voltage rail by buffering the detected logic high and logic low voltage levels extracted from the representative signal. This logic high voltage rail and logic low voltage rail may further be used as power connections to one or more digital data transmitters as a means for defining the output logic high and output logic low levels to equal the logic high and logic low estimates extracted from the template signal. The digital data transmitters can be embodied by buffers with rail to rail output stages or by unity gain amplifiers each with an input selector connecting the input of the unity gain buffer to the logic high level rail whenever the logic signal to be output by said unity gain buffer is high and to the logic low level rail whenever the logic signal to be output by said unity gain buffer is low as a means for defining the output logic high and output logic low levels to equal the logic high and logic low estimates extracted from said representative signal.

Specific embodiments of the present invention will be described in the following with reference to the accompanying drawings.

Figure 1:
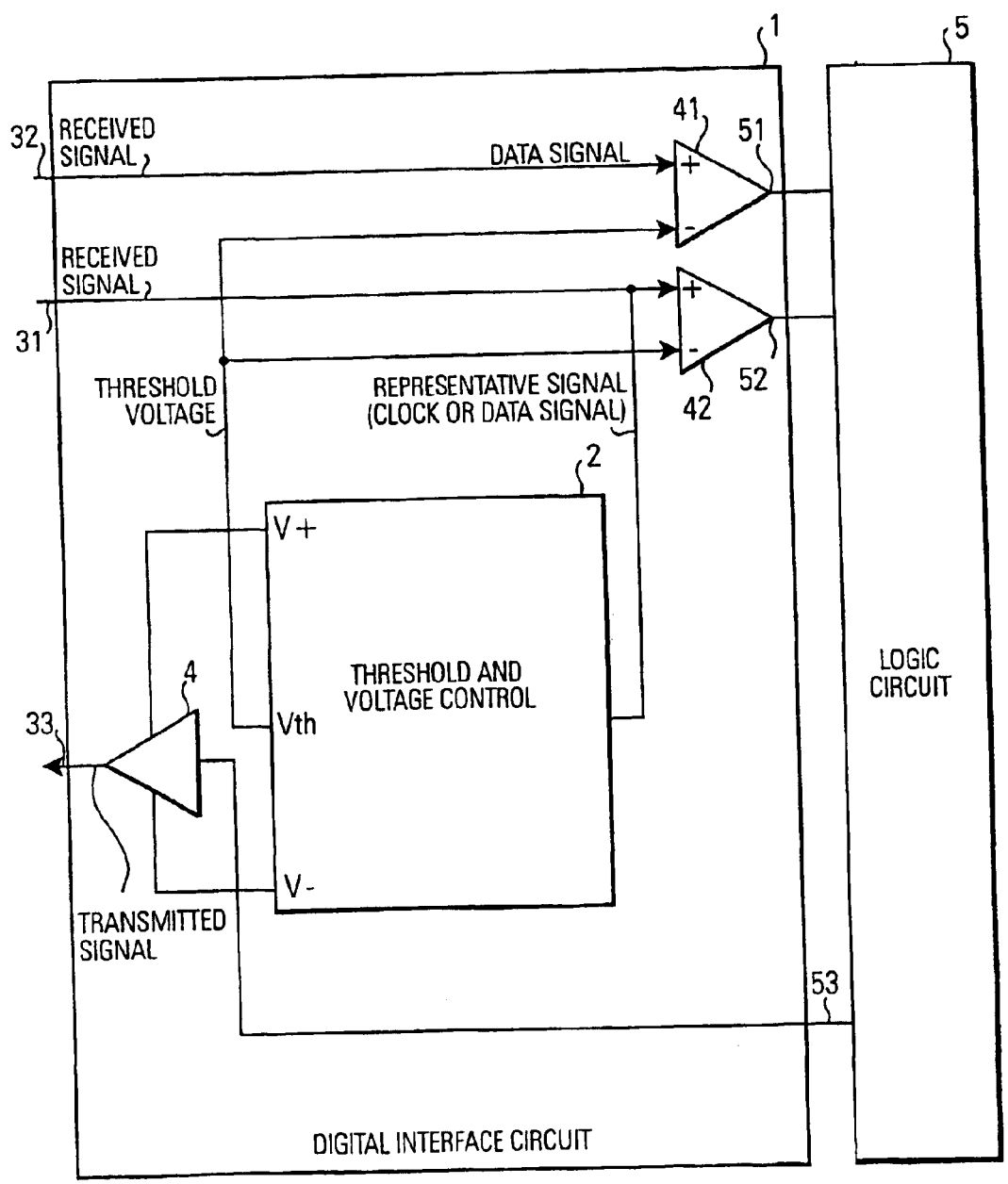
FIG. 1 shows an embodiment of a digital logic interface circuit comprising a receive and transmit circuit for binary logic signals.

Detailed descriptions of a few embodiments of the present invention will follow. In the figures below analog signals with analog processing and analog storage elements are shown for the stored quantities. The same circuit principles can be used with digitized signals, digital signal processing and digital storage elements. For reasons of simplicity, in the figures signals and parts/lines carrying the respective signals are denoted with the same reference numerals.

FIG. 1 shows a receive and transmit circuit for binary logic signals according to an embodiment of the present invention. There is provided an input for a representative signal 31, a threshold and voltage control circuit 2, and one or more output drivers 4 for sending digital logic output signals 33 to other circuits or system sections not shown in the figure. There are further provided one or more inputs for data signals 32 having logical high and logical low values similar to those of the representative signal 31, and an interface output driver 41, 42 for each data signal which provide corresponding digital interface output signals 51, 52 to a digital logic circuit for processing received logic signals 51, 52 providing other logic signals 53. The logic circuit block 5 shown in FIG. 1 receives and provides logic signals adopting a predetermined logic signaling level definition like CMOS or TTL. It can perform any kind of function or operation, either logic or analog or both. The specific functions of circuit 5 are not part of the present invention, nor is the invention limited to any specific features of the circuit 5. A threshold voltage determined by the threshold and voltage control circuit 2 is connected to the inverting inputs of the drivers 41, 42. The threshold and voltage control circuit 2 further provides positive and negative power supply rails to the output drivers 4 such that the logical high and low values of the digital signal at the outputs of the output drivers 4, correspond to the positive and negative power supply rails voltage, respectively.

Thus in operation, the threshold and voltage control circuits 2 of this embodiment analyses the representative signal 31 so as to determine the logical high and logical low voltage values of said signal, and to provide corresponding voltages as power supply rails to the output driver, 4 so that the output signal 33 has corresponding logical high and logical low voltages, and further the threshold voltage control circuit 2 analyses the representative signal 31, e.g. clock or template signal, so as to determine a cross-over threshold voltage, voltages below which being interpreted as logical low, and voltages above which being interpreted as logical high, and supplying this threshold voltage to the interface output drivers 41, 42 for use in determining the logical values of incoming logic signals 31, 32. The interface output drivers 41, 42 pass the logic levels thus determined on to a destination, e.g. subsequent sections, using a predetermined logic signaling level definition. The destination further processes the received logic signals and also provides other logic signals for transmission to other destinations through the digital interface circuit, as indicated by the arrows-between the digital interface circuit and the destination, which arrows each represent one or more digital logic signal channels. While FIG. 1 shows for reasons of simplicity a single output driver 4 for transmitting signals, it is to be understood that any number of signal outputs for transmitting signals can be provided.

A clock signal or DC balanced data signal available from the source with unknown logic levels are suitable as representative signals for the logic levels to be used for communication. If such a signal is available, the threshold level for interpreting input signals can be generated as a low pass filtered average of the template signal. The logic high and logic low levels can be determined by peak detectors or level samplers. If only ground-referenced logic families need to be handled and ground potential offsets are negligible, a low level detector is not needed. A fixed ground level can then be used instead of the logic low level estimate voltage.

In circuits that are only required to operate properly in the presence of a clock signal or line encoded data signal from the outside signal source, the optimum threshold level can be determined by low pass filtering. Clock signals and DC balanced line encoded data signals have an average input voltage that falls halfway between the logic levels. One such signal is selected as a template signal for sensing the logic levels from the external source, and low pass filtered with a cutoff frequency substantially lower than the lowest frequency on the template signal. This produces an average of the input template signal on the output of the low pass filter. Using this voltage as the reference voltage for differential line receivers for all input signals from the same source will place the decision threshold at the optimum point halfway between the voltages of the two logic levels.

Figure 2:
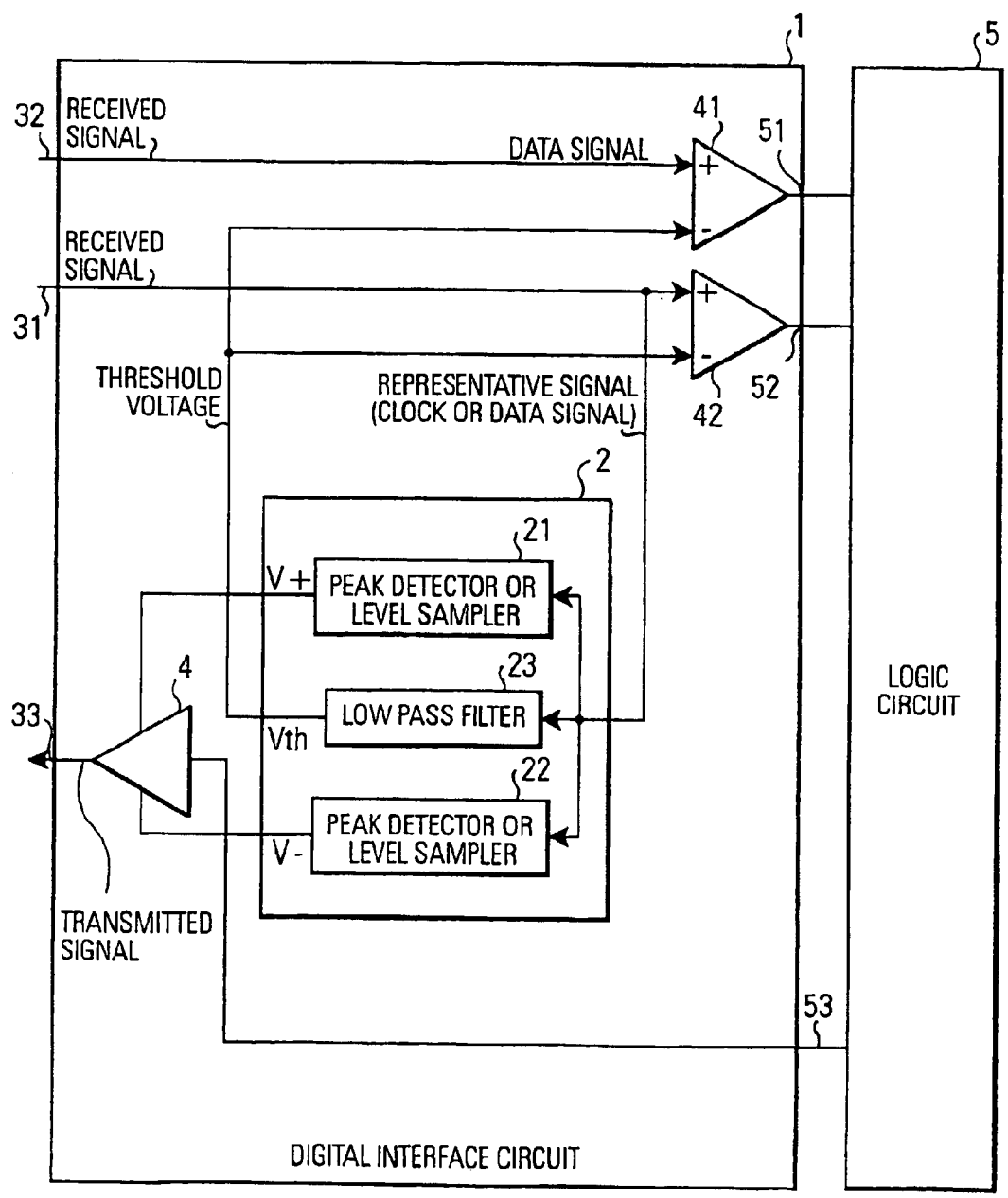
FIG. 2 shows in more detail the components of a threshold and voltage control circuit in the embodiment of FIG. 1.

FIG. 2 shows in more detail the components of the threshold and voltage control circuit 2 according to a first embodiment of the invention. In addition to the components described with reference to FIG. 1, which in FIG. 2 bear the same reference numerals as in FIG. 1, there is provided as subunits of the threshold and voltage control circuits 2, a first peak detector or level sampler 21, a second peak detector or level sampler 22 and a low-pass filter 23 for determining an input signal taken as the average of the representative signal. All three of these subunits 21, 22 and 23 are connected to receive the input representative signal 31, and the first peak detector or level sampler 21 is connected to the positive supply rail V+ of the output drivers 4 the threshold determining means 23 is connected to the inverting input of the output drivers 41, 42, and the second peak detector or level sampler 22 is connected to the negative power supply rail V− of the output drivers 4.

In operation, the first peak detector or level sampler 21 operates so as to detect the logical high voltage value of the incoming representative signal 31, the second peak detector or level sampler 22 operates so as to detect the logical low voltage level of the representative signal 31, and the threshold level detector 23 performs a low-pass filter averaging function on the representative signal 31, so as to determine a threshold voltage value as described above. If only ground reference logic families needs to be handled and ground potential offsets are negligable, it is possible to dispense with the low level detector. A fixed ground level can then be used instead of the logic low level estimate voltage.

In the embodiments of the invention described with reference to FIG. 2, it is assumed that the representative signal comprises a regular clock signal or line encoded data signal, such that the average voltage falls half-way between the two logic levels.

If no DC balanced representative signal is available, or if clock stopping must be supported, adaptive binary logic can be equipped with one of a couple of different input threshold optimizers to cater for this situation. Two analog implementations will now be described, both of which react to transients on the input data signal.

Figure 3:
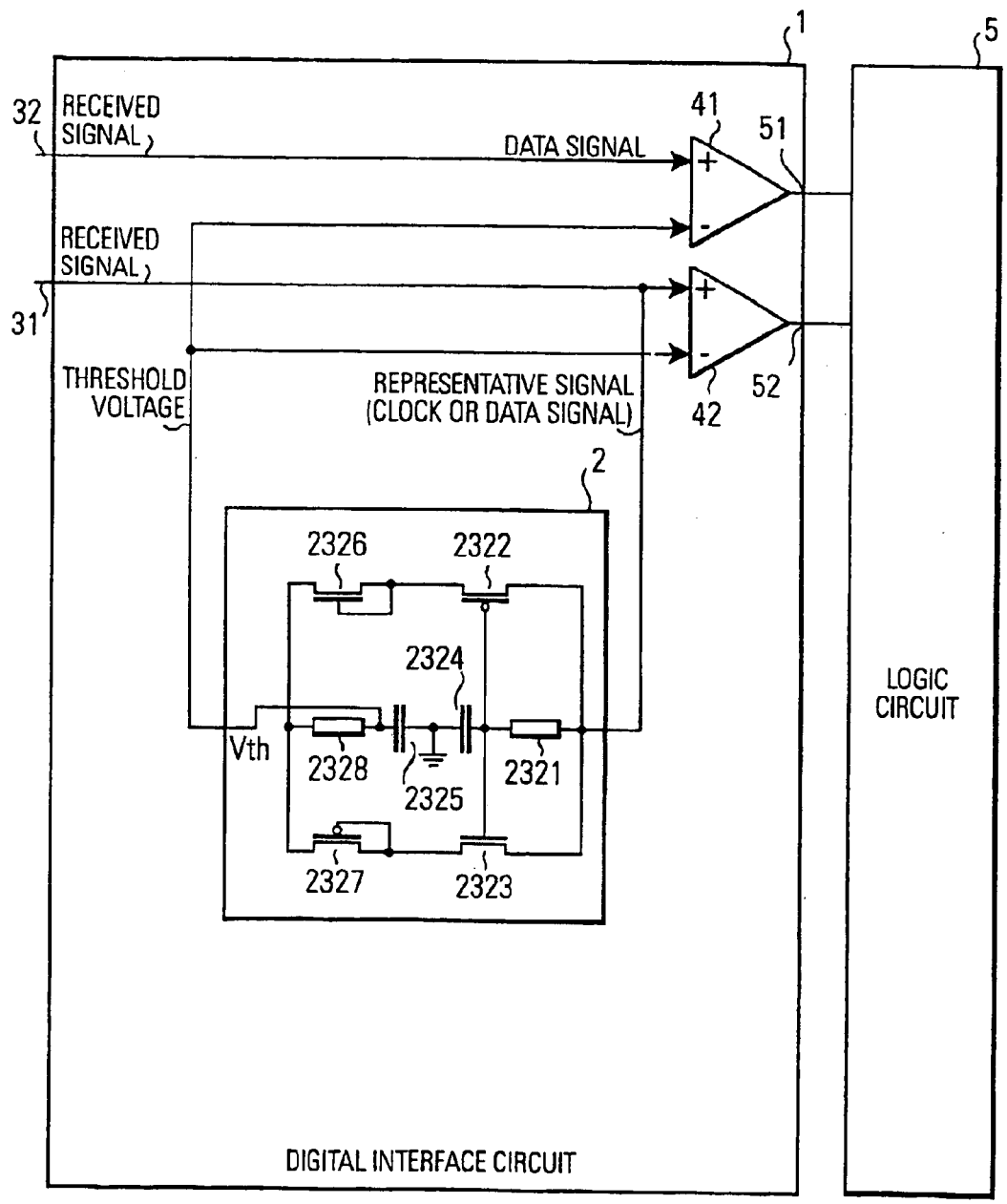
FIG. 3 shows a further embodiment of a threshold signal generating circuit in a digital logic interface circuit according to the embodiment of FIG. 1.

FIG. 3 shows a further embodiment of the present invention, in which the variable threshold determining circuit 2 comprises an adaptive binary logic circuit. According to this embodiment, the voltage threshold determining circuit 2 comprises a first capacitor 2324, one terminal of which is connected to earth, a p-channel transistor 2322, and an n-channel transistor 2323, the gates of which are both connected to the second terminal of the capacitor 2324, and the sources of which are connected to the representative signal 31. There is further provided a resistor 2321, which is connected between the representative signal 31, and the gates of said transistors 2322 and 2323. A further n-channel transistor 2326 is provided, the gate and drain of which are coupled together and further coupled to the drain of said first p-channel transistor 2322, and a second p-channel transistor 2327, the gate and drain of which are coupled together and further coupled to the source of said first n-channel transistor 2323. The sources of both second p-channel transistor 2327 and second n-channel transistor 2326 are coupled together and to a first terminal of a second resistor 2328, the second terminal of which provides the output of the voltage threshold detection device, and is coupled to the inverting input of the interface output drivers 41 and 42. There is further provided a second capacitor 2325, one terminal of which is connected to ground, and the other is connected to the output of the voltage threshold determining circuits 23. When a positive edge occurs in the representative signal a voltage drop will occur across resistor 2321 until the voltage across the capacitor 2334 has followed this transition of the input representative signal. The voltage drop across resistor 2321 will thus temporarily turn the p-channel transistor 2322 conductive, the duration of the conductive state being determined inter alia by the resistance and capacitance, respectively, of the elements 2321 and 2324. During this conductive period following a positive edge in the input representative signal, a circuit exists from the source of p-channel transistor 2322 through n-channel transistor 2326 acting as a diode, to an integrator circuit which in this embodiment comprises a series connection of resistor 2328 and capacitor 2325. Similarly, if a negative edge occurs in the representative signal at the input of circuit 2, the n-channel transistor 2323 will temporarily turn conductive, and resulting in a temporary connection of the integrator circuit 2328, 2325 to the input of threshold determining circuit 2 through the p-channel transistor 2327 acting as a diode.

The threshold generating circuit 2 according to this embodiment can thus provide an average depending on the low and the high signal amplitude levels of the input representative signal, but largely independent from the duration of the respective logic states of the input representative signal. The threshold generating circuit of this embodiment can, therefore, also process data signals showing a random alternation of logic states.

This circuit has the effect of sampling the representative signal for a predetermined period after each transition. The RC circuit formed by resistor 2328 and capacitor 2325 is provided so as to average this sample signal, to provide the voltage threshold value to the interface output drivers 41, 42.

This circuit thus has the effect of maintaining a weighted average of the input voltage, where voltage is occurring shortly after transients on the input are weighted much higher than all those occurring in steady state conditions.

The circuit reacts to transients exceeding the threshold voltage for one of the two input transistors across resistor 2321. The upper path is a charging-path for the capacitor 2325 on the output, and the lower current path is for discharging the output capacitor 2325. This capacitor maintains a weighted average of the input voltage, where voltages occurring shortly after transients on the input are weighted much higher than are those occurring in steady state situations. A transient of enough amplitude to overcome transistor threshold voltages will make one of the input transistors conductive for a period of time determined by the RC network 2321, 2324 connected to its gate electrode. The weighted average is used as a reference for discriminating the logic state of input signals in the interface output buffers 41, 42.

Figure 4:
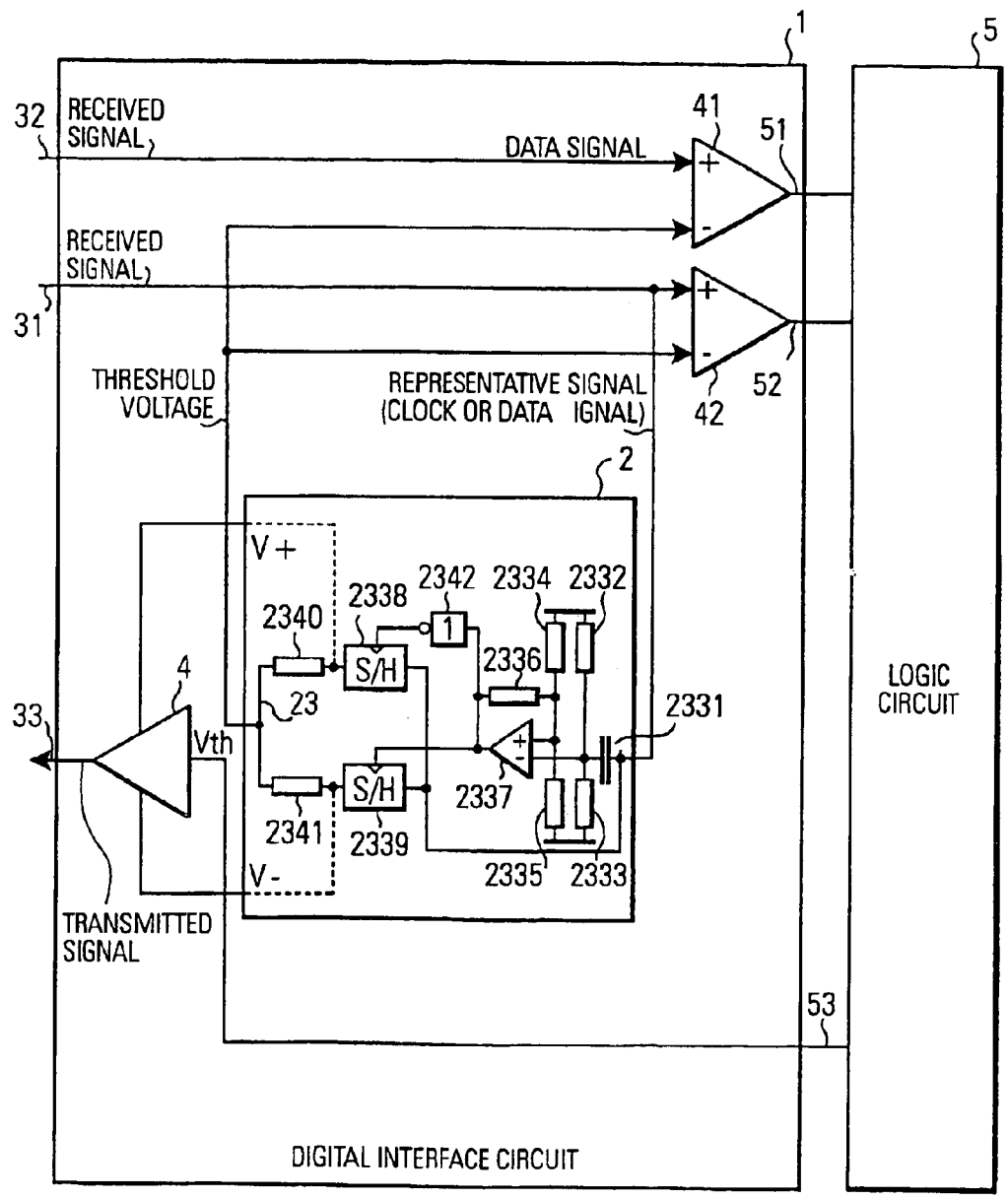
FIG. 4 shows a yet another embodiment of a threshold signal generating circuit in a digital logic interface circuit according to the embodiment of FIG. 1.

FIG. 4 shows a further embodiment of a threshold generating circuit 2. All other elements of FIG. 4 retain the numbering of the previous figures and reference is made to the description of the previous figures with respect to these other elements. The threshold generating circuit 2 consists of two pairs of resistors 2332, 2333 and 2334, 2335, respectively, connected as potential divider circuits between a positive and negative power supply rail. A capacitor 2331 is provided coupled between the input representation signal at the input of the threshold generating circuit 2, and the node of the first potential divider circuit between resistors 2332 and 2333. There is further provided a comparator 2337, the inverting input of which is connected to the node of the potential divider circuit between resistors 2332 and 2333, and the non-inverting input is connected to the node between resistors 2334 and 2335. A further resistor 2336 is connected between the non-inverting input of the comparator 2337 and the output of the comparator 2337. There is further provided an inverter buffer 2342, and a first sample and hold circuit 2339, the inputs of said inverter buffer 2342, and the trigger input of the sample and hold circuit 2339 being connected to the output of the comparator 2337. A second sample and hold circuit 2338 is provided, the trigger input of which is connected to the output of said inverter 2342. The inputs of said first and second sample and hold circuits 2339 and 2338 are connected to the input representative signal 31. A series connection of a further resistor 2341 and a second further resistor 2340 is connected between the outputs of the first and the second sample and hold circuit 2338 and 2339. A node between the resistors 2340 and 2341 constitutes the output of the threshold generating circuit 2. The outputs of the sample and hold circuits 2340, 2341 can be coupled to provide positive and negative power supply voltages V+, V− to the output drivers 4 as described above. To this end buffers for lowering the source impedance may be provided, which are not shown in the figure. Possible implementations of such circuits for buffering the voltages V+, V− may include emitter followers, source followers, operational amplifiers with feedback from the output to the negative input, and the like. All these and other buffer circuits are suitable and well known in the art.

In operation, the differential voltage comparator 2337 of this embodiment is biased at a noise rejection offset from its equilibrium point by means of the feedback network 2334, 2336, 2335 creating a positive noise rejection offset if the output of the differential voltage comparator 2337 is high and a negative noise rejection offset from the equilibrium if the output of the differential voltage comparator 2337 is low. Combined with an input signal capacitively coupled to the negative input of said differential voltage comparator 2337, this yields a signal at the output of comparator 2337 which changes state whenever the input signal exhibits a transient with an amplitude exceeding said noise rejection offset voltage. The resulting pulses can be used as sampling pulses for determining first order estimates of the logic high and logic low levels of the input representative signal. A threshold voltage for interpreting one or more input signals with properties similar to those of the input representative signal is determined by creating an average with the potential divider comprising the resistors 2340 and 2341, of said first order estimates of the logic high and logic low levels of the template input logic signal.

The comparator 2337 generates sampling signals for sampling sample and hold circuits 2338 and 2339 that maintain first order estimates, i.e. time averages of the representative signal amplitude levels taken during time intervals determined by the edges occurring in the representative signal. These first order estimates are averaged by a potential divider formed by resistors 2340 and 2341 to create an adaptive threshold for interpreting the input signals in the one or more interface output buffers 41, 42. This sampling pulse generator also reacts to transients on the inputs exceeding a certain limit value. This value is defined by the ratio between resistors 2332 and 2333, and 2334 and 2335, respectively, and is therefore adjustable. The ratios are chosen so that the transient detection threshold is low enough for the lowest logic level to overcome these limits, but high enough for suppressing noise from affecting the first order estimate.

Alternatively, digital signal processing can be used for extraction of threshold and logic levels. The sampling frequency should be more than twice the maximum fundamental frequency of the input representative signal to be sure to capture both the high and the low level. If the sampling frequency is substantially higher than the maximum fundamental signal frequency, input data can be determined directly from the data samples, otherwise a faster receive process is obtained by calculating and then D/A converting a suitable threshold level for differential data receivers 41, 42 as described above. Several signal processing functions can be used for determining estimates of the logic high and logic low levels. For example, a discrimination procedure rejecting amplitude calculations yielding signal amplitude results below a limit amplitude as a means of stopping noise from being interpreted as the input signal during longer periods without change of level of said digital input signals may be appropriate.

Figure 5:
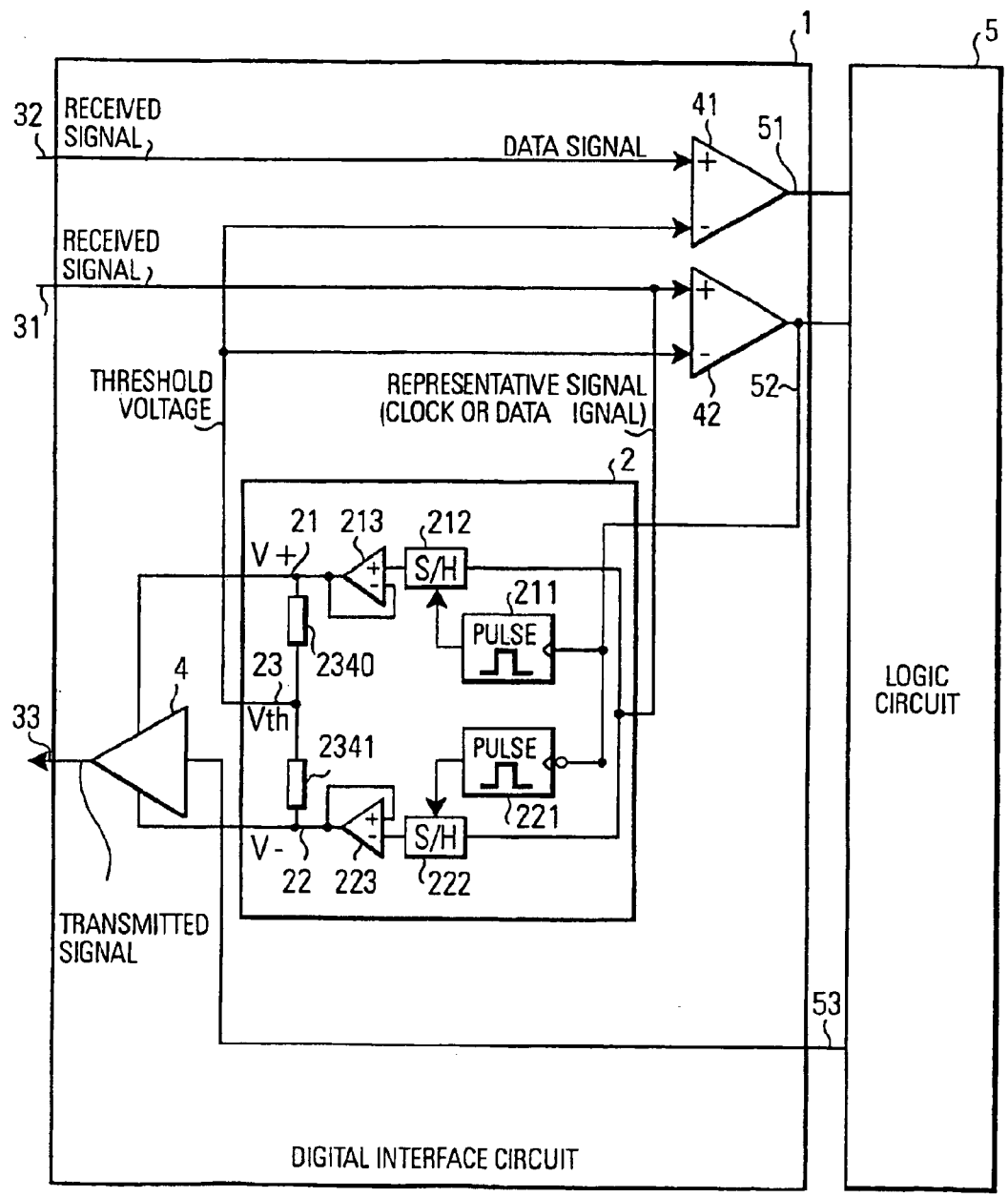
FIG. 5 shows details of an embodiment of a circuit for detecting logical high and logical low voltage levels.

FIG. 5 shows a further embodiment of the threshold generating circuit 2, comprising means for detecting the logical high and logical low voltage levels V+ and V−, respectively. Again with respect to all other elements in FIG. 5 retaining the same numbering as in other figures, reference is made to the description of these elements in the context of the other figures.

The threshold generating circuit 2 according to this embodiment comprises a positive edge triggered pulse generator 211, a sample and hold circuit 212, and a buffer 213. The pulse generator 211 is triggered by the input representative signal, and preferably by the output of an output driver 42 providing a replica of the input representative signal, as shown in FIG. 5. The sample and hold circuit input is connected to the input representative signal 31, and the trigger of the sample and hold circuit is connected to the output of the pulse generator 211. The output of the sample and hold circuit 212 is connected to the non-inverting input of the buffer 213, the output of which provides the positive power supply rail for the output drivers 4. Similarly, the logic low voltage level detection circuit 22 comprises a falling edge triggered pulse generation circuit 221, a sample and hold circuit 222 and a buffer 223, where the input of the pulse generator 221 is connected to receive said input representative signal, or preferably, to receive a signal from the output 52 of an output driver 42, which carries a replica of the input representative signal 31. The trigger input of the sample and hold circuit 222 is connected to the output of the pulse generator 221, the input of the sample and hold circuit 222 is connected to the input representative signal 31, and the output of the sample and hold circuit is connected to the input of the buffer 223, the output of which is connected to the negative voltage supply rail for the output drivers 4. A further resistor 2341 is, connected between the output of the first buffer 213 and the output of the threshold generating circuit 2, and a second further resistor 2340 is connected between the output of said second buffer 223 and the output of said threshold generating circuit 23.

The pulse generated by the pulse generators 211 and 221 is short compared to the positive or negative pulse time of the input representative signal. Since the pulse generator 211 is triggered on a rising edge and the pulse generator 221 is generated on a falling edge, the sample and hold circuits 212 and 222 will be triggered to sample the logical high and logical low voltage levels, respectively. The outputs of the sample and hold circuits are buffered to provide a power source of the appropriate level adapted to the levels found by the threshold generating circuit in the input representative signal 31.

The digital logic interface circuit as described above, translates signal amplitude levels of digital logic input signals to those used inside a destination circuit for performing logic signal processing on the received logic signals, thus implementing adaptive level logic by providing a level adapted replica of the digital input logic signals. In these embodiments of FIG. 5, the replica signal triggers' two pulse generators creating sampling pulses shorter in duration than the minimum bit interval or pulse time of the template signal. The first pulse generator fires on positive edges of the template replica, and the other pulse generator fires on negative edges of the template replica. The output signal from the first pulse generator gates a sample-and-hold circuit, which stores an estimate of the logic high level of the template signal. The output signal from the second pulse generator gates a sample-and-hold circuit, which stores an estimate of the logic low level of the template signal. The logic high and logic low estimates are buffered and used as power rails or output level references for the digital signal drivers 4 outputting signals to be sent to the destination as from where the input template signal is originating, or to other system sections. In this manner, sent signals will use the same logic high and logic low voltages as signals originating from that block.

Depending on the demands of the application where adaptive binary logic is used, modifications and additions to the concepts described above can be implemented without leaving the scope of the invention. An alternate form of pulse generator can be used if signals with significant overshoot or ringing must be handled. Some protection against upsets by ringing can be offered by using long enough sampling pulses. Preferably the sampling pulse should be long enough for any ringing to have died out before the end of the tracking period. If the range of frequencies to be handled is too wide to meet this requirement with a fixed sampling pulse width, a clock tracking PLL or DLL based pulse generator can be used in order to adjust the sampling instant in proportion to the frequency or bit rate used. If a clock signal is available, a DLL based solution is preferred. The input clock signal is delayed with an adjustable delay line and the output of the delay line is input to a phase comparator together with the input clock signal. In an ordinary DLL manner the phase comparator controls the delay of the delay line via a loop filter, and the DLL is set up such that equilibrium is reached when the input and output signals of the delay line are 90 degrees out of phase. In this way sampling edges (or track and hold endpoints) can conveniently be generated to match for example a quarter period of the input template clock signal.

If no clock signal is available, a clock signal can be extracted from a data signal by means of a clock recovery PLL. Such a clock signal can be used for sampling the high and low logic levels of a data signal taken as an input representative signal. The signal that is used for clock extraction should suffice also for logic level sampling. The logic level samples can be binned into the high and low category by pre or post sampling categorization as described above.

While specific embodiments of the present invention have been described in detail above, the present invention should not be construed to be limited thereto. A large variety of modifications will become apparent to those skilled in the art from the description of the invention, which modifications fall within the scope of the invention described in the claims.

What is claimed is:

1. A digital logic signal interface circuit (1) for adaptively receiving and discriminating at least one digital logic input signal (31,32) taking signal amplitude levels each representative of one of a plurality of different logic levels in accordance with a logic signalling definition, said digital logic signal interface circuit (1) comprising
   a circuit (2) adapted to receive a digital logic representative signal (31) taking signal amplitude levels representative of said logic signalling definition, for generating a threshold signal (Vth) depending on a logic swing amplitude occurring in said digital logic representative signal (31), said threshold signal generating circuit (2) comprising an amplitude detector circuit (21,22) for detecting at least one signal amplitude level repetitively taken by said digital logic representative signal (31), and for providing at least one amplitude detection signal (V+, V−) which is indicative of said at least one detected signal amplitude level;
   a logic level discriminator circuit (41,42) adapted to receive said at least one digital logic input signal (31,32) and said threshold signal (Vth), and adapted to provide for each of said at least one digital logic input signal a corresponding digital interface output signal (51,52) taking one of a plurality of predetermined signal amplitude levels indicative of a result of comparing said digital logic input signal (31,32) amplitude level to said threshold signal (Vth); characterized by
   at least one output buffer circuit (4) adapted to receive a digital logic interface input signal (53) and to generate in accordance therewith, a digital logic output signal (33) taking signal amplitude levels each representative of one of said plurality of different logic levels;
   said output buffer circuit (4) being coupled to receive said at least one amplitude detection signal (V+, V−) from said amplitude detector circuit (21,22) and to generate said signal amplitude levels in accordance with said at least one amplitude detection signal, such that said digital logic output signal (33) can adaptively meet said logic signalling definition of said digital logic input signal (31,33).

2. The digital logic signal interface circuit according to claim 1, wherein said threshold signal generating circuit (2) comprises
   a threshold generator circuit (2340,2341) for generating said threshold signal (Vth) depending on said at least one amplitude detection signal (V+, V−).

3. The digital logic signal interface circuit (1) according to claim 2, wherein said amplitude detector circuit (21,22) comprises a peak detector circuit for extracting at least one peak amplitude level in said digital logic representative signal (31).

4. The digital logic signal interface circuit according to claim 2, wherein said amplitude detector circuit (2321,2324; 2331-2333; 211,221) comprises an edge detector circuit for detecting the occurrence of edges in said digital logic representative signal, and a sampling circuit (2322,2323; 2338,2339; 212,222) for sampling the signal amplitude of said digital logic representative signal (31) at times controlled by said edge detector circuit.

5. The digital logic signal interface circuit (1) according to claim 4, wherein said sampling circuit (2322,2323,212, 222) is adapted to sample the signal amplitude of said digital logic representative signal during an extended sampling time interval, and to generate said amplitude detection signal (V+, V−) based on low pass filtering the section of said digital logic representative signal (31) taken during said extended sampling time interval.

6. The digital logic signal interface circuit (1) according to claim 5, wherein said sampling circuit (2322,2323,2328, 2325) is adapted to generate said amplitude detection signal based on a time average of or low pass filter operation performed on the signal amplitude of said digital logic representative signal (31) section taken during said extended sampling time interval.

7. The digital logic signal interface circuit according to claim 5, wherein said extended sampling time interval has a duration in the order of half the data clock period of said digital logic representative signal (31).

8. The digital logic signal interface circuit according to claim 5, wherein said extended sampling time interval extends from one edge occurring in said digital logic representative signal (31) to the next edge in said digital logic representative signal (31).

9. The digital logic signal interface circuit according to claim 4, comprising a sampling delay circuit for delaying sampling of said digital logic representative signal (31) by a predetermined amount after the occurrence of an edge in said digital logic representative signal (31).

10. The digital logic signal interface circuit according to claim 1 wherein
    said amplitude detector circuit (21,22) is adapted to detect a high signal amplitude level and furthermore, a low signal amplitude level taken by said digital logic representative signal (31), and to provide corresponding high amplitude and low amplitude detection signals (V+, V−), respectively; and
    said threshold generator circuit (2) comprises a level averaging circuit (23,2340,2341) coupled to provide an average of said high amplitude and low amplitude detection signals as said threshold signal.

11. The digital logic signal interface circuit (1) according to claim 1, wherein said amplitude detector circuit is adapted to detect a high signal amplitude level taken by said digital logic representative signal, and to provide a corresponding high amplitude detection signal; and said threshold generator circuit (2) comprises a signal level divider circuit for dividing the signal level of said high amplitude detection signal by about two, in order to provide said threshold signal.

12. The digital logic interface circuit (1) according to claim 1, wherein said threshold signal generating circuit (2) comprises a low pass filter circuit (23) for filtering said digital logic representative signal (31) and extracting a DC component therein as said threshold signal.

13. The digital logic interface circuit (1) according to claim 12, wherein said low pass filter circuit (23) comprises a sample and hold circuit for sampling said digital logic representative signal, an analog to digital converter for converting the samples provided by said sample and hold circuit into a digital representation, a digital filter circuit for processing the digital samples obtained from said sample and hold circuit, and a digital to analog converter for converting the digital output of said digital filter into said threshold signal (Vth).

14. The digital logic interface circuit (1) according to claim 1, wherein said circuit (2) for generating a threshold signal is coupled with said logic level discriminator circuit (41,42) to receive said digital logic input signal received by said logic level discriminator circuit as said representative signal (31).

15. The digital logic interface circuit (1) according to claim 1, wherein said circuit for providing a threshold signal (Vth) is coupled to receive a digital logic signal (31) different from said at least one digital logic input signal (32) as said digital logic representative signal.

16. The digital logic interface circuit (1) according to claim 15, wherein said digital logic representative signal (31) is a clock signal and said at least one digital logic input signal is a data signal.

17. The digital logic interface circuit (1) according to claim 1, wherein said logic level discriminator circuit (41, 42) is adapted to provide said at least one digital interface output signal (51,52) at a first one of said predetermined signal levels when said corresponding digital logic input signal (31,32) has a signal level above said threshold signal level (Vth), and at a second one of said predetermined signal levels when said corresponding digital logic input signal (31,32) has a signal level below said threshold signal level (Vth).

18. A digital logic circuit (1,5) having at least one input (31,32) for receiving at least one digital logic input signal taking signal amplitude levels each corresponding to one of a plurality of different logic levels, and at least one output (33) for outputting at least one digital logic output signal, furthermore having a digital logic processing circuit (5) for performing logical operations on said at least one digital logic input signal, and for providing at least one logic output signal (53), said,digital logic circuit comprising a digital logic interface circuit (1) according to claim 1, coupled between said input (31,32) and output (33) on the one hand and coupled on the other hand to receive from said logic processing circuit (5) said at least one digital logic interface input signal (53) and to provide to said logic processing circuit said at least one digital logic interlace output signal (51,52).

* * * * *